(12) United States Patent
Xiao

(10) Patent No.: US 8,767,304 B2
(45) Date of Patent: Jul. 1, 2014

(54) BEAM SHAPING DEVICE FOR FOCUSING LIGHT BEAMS FROM SEMICONDUCTOR LASER

(75) Inventor: Yi-Xuan Xiao, Beijing (CN)

(73) Assignees: Yi-Xuan Xiao, Beijing (CN); Ding-Rong Qian, Shanghai (CN)

( * ) Notice: Subject to any disclaimer, the term of this patent is extended or adjusted under 35 U.S.C. 154(b) by 49 days.

(21) Appl. No.: 13/260,567

(22) PCT Filed: Mar. 25, 2010

(86) PCT No.: PCT/CN2010/071321
§ 371 (c)(1),
(2), (4) Date: Sep. 26, 2011

(87) PCT Pub. No.: WO2010/108446
PCT Pub. Date: Sep. 30, 2010

(65) Prior Publication Data
US 2012/0019909 A1    Jan. 26, 2012

(30) Foreign Application Priority Data
Mar. 26, 2009    (CN) ...................... 2009 2 0106858 U

(51) Int. Cl.
*G02B 27/14*    (2006.01)

(52) U.S. Cl.
USPC ................. 359/629; 359/485.06; 359/856

(58) Field of Classification Search
USPC ............. 359/485.01–485.07, 489.08–489.13, 359/528–530, 542–543, 546, 618–619, 359/629–630, 633, 636, 638–640, 831, 359/833–834, 837, 838, 839–840, 850, 359/855–857, 861; 372/29.01, 29.014, 372/29.016, 29.02–29.32
See application file for complete search history.

(56) References Cited

U.S. PATENT DOCUMENTS

| | | | | |
|---|---|---|---|---|
| 5,513,201 A | * | 4/1996 | Yamaguchi et al. | 372/75 |
| 5,748,369 A | * | 5/1998 | Yokota | 359/485.03 |
| 6,028,722 A | * | 2/2000 | Lang | 359/834 |
| 6,240,116 B1 | * | 5/2001 | Lang et al. | 372/50.12 |
| 6,324,190 B1 | * | 11/2001 | Du et al. | 372/9 |

FOREIGN PATENT DOCUMENTS

| | | |
|---|---|---|
| CN | 2566292 Y | 8/2003 |
| CN | 1587895 A | 3/2005 |
| JP | 2004212518 A | 7/2004 |
| JP | 2007328080 A | 12/2007 |

* cited by examiner

*Primary Examiner* — Stephone B Allen
*Assistant Examiner* — James McGee
(74) *Attorney, Agent, or Firm* — Cheng-Ju Chiang

(57) ABSTRACT

A beam shaping device, consists of a polarization beam splitter interface (PBS interface), four light surfaces and at least one light processing surface, as well as various entities are described. The PBS interface passes light in P polarization and reflects light in S polarization; two of the four light surfaces are light I/O surfaces, and the other two of them are light surfaces for processing (LSFP); the light processing surface is arranged and oriented to retro-reflect, or close to retro-reflect light beam coming from said PBS interface and back it to where it comes from, and, in the meantime, physically rotate the reflected light beam around its propagating direction by 90°, or close to 90°. The invention works for light beam in any polarization status including non-polarized beam.

6 Claims, 15 Drawing Sheets

US 8,767,304 B2

BEAM SHAPING DEVICE FOR FOCUSING LIGHT BEAMS FROM SEMICONDUCTOR LASER

CROSS REFERENCE TO RELATED APPLICATIONS

The present application is a 35 U.S.C. §371 National Phase conversion of International (PCT) Patent Application No. PCT/CN2010/071321, filed on Mar. 25, 2010, the disclosure of which is incorporated by reference herein. The PCT International Patent Application was published in Chinese.

FIELD OF THE INVENTION

This invention relates generally to optical systems and, more particularly, to a beam shaping device for light beam array emitted from semiconductor laser to achieve symmetric size-divergence product in lateral and longitudinal directions.

BACKGROUND OF THE INVENTION

It is well-known that the size-divergence product (SDP) of a light beam is an optical invariance throughout an optical system. It is also well-known that the properties of light beam emitted from edge emitting semiconductor laser, or diode laser, are quite different from other laser beams, in that its SDP in lateral direction, which is in parallel to the direction of its PN junction or quantum well plane, and SDP in transverse directions, which is perpendicular to the direction of PN junction or quantum well plane, are quite different. This huge difference in SDPs along the two directions causes substantial difficulties in diode laser applications where a uniform beam property is required, for example focusing beam into a small round spot.

To overcome the difficulty caused by the inherent asymmetric property of edge emitting diode laser, there are a number of beam shaping techniques to create round beam spot from line-like emission out of edge emitting diode laser. Techniques have been developed which reformed the laser beam, such as a china patent (ZL 02 2 53490.3, issued on Aug. 13, 2003).

This invention provided an apparatus for converting light beams includes a light source that can emit a light beam array and multiple roof reflectors. Each roof has two reflecting surfaces intersecting along a common vertex edge to form a dihedral angle between them. The dihedral angle is the integer times of 45°, but not greater than 90°. The roof reflectors are fixed on a substrate having a cardan under its lower surface. The horizontal and vertical components of the light beam orientation emitted by light source are interchanged. The performance of the conversion apparatus doesn't relate to the wavelength of the light beam.

By using the apparatus for converting light beams, each of the light beams is retro-reflected and rotated by 90° around its propagating direction. So the SDP in lateral and longitudinal directions can be adjusted that it is possible to focus the light beams into a small spot. But the propagating direction of the reflected light beam must be different from the incident light beam. To solve this problem, the roof reflectors can be rotated by 45° around direction X, so that the light beam reflected by the roof reflectors can be rotated by 90° around direction X. It means that the reflected light beam propagate in direction Y and rotate by 45° around direction Z. For all these reasons, there is a difference of light path between adjacent reflected light beams.

SUMMARY OF THE INVENTION

This invention is to manipulate array of light beams to change their SDP in lateral and transverse directions, in addition, some of the embodiments of this invention can collimate beam divergences in the lateral and transverse directions.

This invention, particularly, is a beam shaping device which looks like a variation of polarizing beam splitter (PBS) with following features: a plane (PBS interface) which splits light beam according to light polarization status (P or S); two cylindrical surfaces which collimate incident beam and emerge beam; two arrays of roof reflectors which retro-reflect light beams and, in the meantime, rotate each light beam by 90° around its propagating direction. When an array of light beams incidents on the device, the lateral divergence of the light beams is collimated at incident cylindrical surface, the collimated beam array travels in the device and reaches the PBS interface, where P component of each light beam passes the PBS interface and S component of each beam is reflected by the PBS interface. The passed array of light beams and the reflected array of light beams continue to travel until each of them arrives at an array of 90° roof reflectors, where each of the light beams is retro-reflected and rotated by 90° around its propagating direction, then the two retro-reflected arrays of light beam travel back to the PBS interface. Because of the 90° rotation, polarization status of the two arrays of light beams is swapped, they leave the PBS interface in directions other than incident directions. Thus, the incident array of light beams is turned into a new array of light beams which is fully collimated with altered beam configuration. The new array of light beam is ready for being focused into a small spot.

One of the embodiments of this invention provides the ability of stacking arrays of light beams emitted from semiconductor laser bars without physically stacking the bars.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The beam shaping device in this invention is a further development of previous china patent (ZL 02 2 53490.3) with implementation of key optical parts which eliminate the difference of light path between adjacent reflected light beams.

Figure 1:
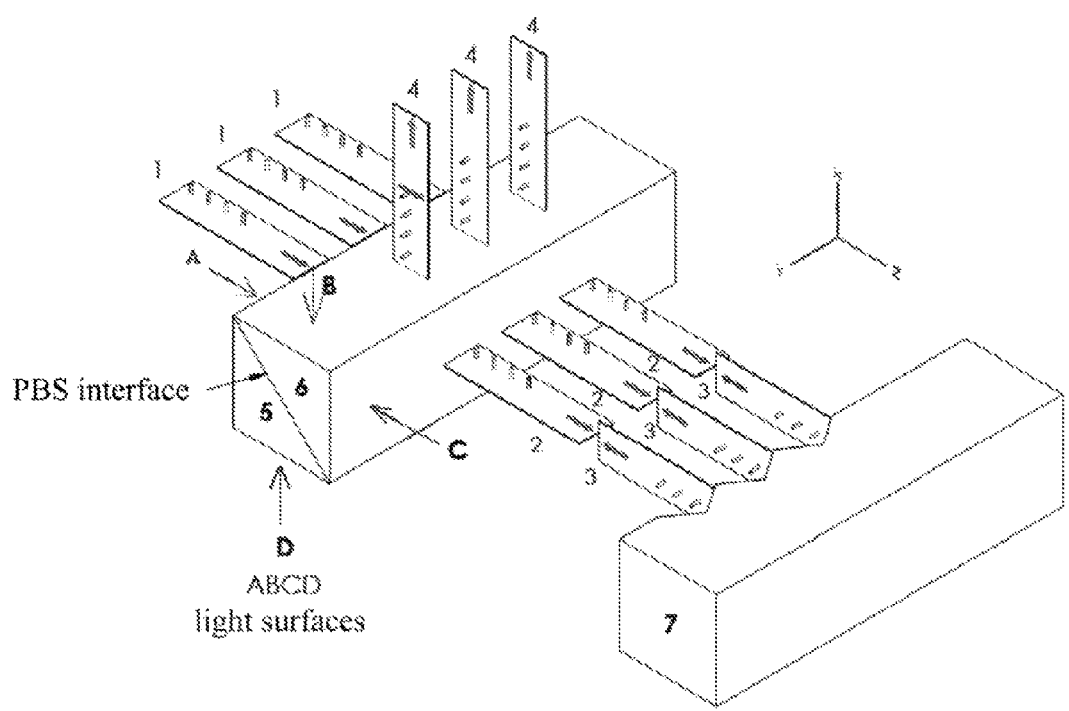
FIG. 1 is a schematic view of a basic unit of this invention including a polarization beam splitter, a roof reflector array, and its application for an array of P-polarized incident light beams according to one embodiment of the present invention.

FIG. 1 is a schematic view of a basic unit of this invention including one PBS and one array of roof reflectors. The PBS consists of two identical right angle prisms 5, 6, their diagonal rectangular surfaces are attaching surface, two prisms are attached together by their attaching surfaces which functions as PBS interface: light in P polarization passes the PBS and light in S polarization will be reflected by the PBS. The PBS is a regular hexahedron, there are two long side planar surfaces called light surfaces on each prism, one of them is light input/output (I/O) surface and the other is light surface for processing (LSFP). If one long side planar surface A of a prism is assigned as light I/O surface, the other long side planar surface B of the same prism must be LSFP or vice versa. There are two light surfaces on the other prism, too, the long side planar surface on the other prism facing the assigned light I/O surface A is LSFP C and the other long side planar surface of that prism must be light I/O surface D. The surface names come from their functions. Light I/O surface A is where light beams (1, 1, 1) enter the PBS, it is perpendicular to the light beams (1, 1, 1) in the drawing, while light I/O surface B is where output light beams (4, 4, 4) leave the PBS after being processed, and light I/O surface B is perpendicular to light beams (4, 4, 4) in the drawing, too. LSFP C is where light beams (2, 2, 2) leave the PBS for processing, it is perpendicular to the light beams in the drawing, while LSFP D is where light beams would leave the PBS for processing in case the polarization of light beams (1, 1, 1) is S polarization (see FIG. 2), and it is perpendicular to the light beams, too.

Figure 8:
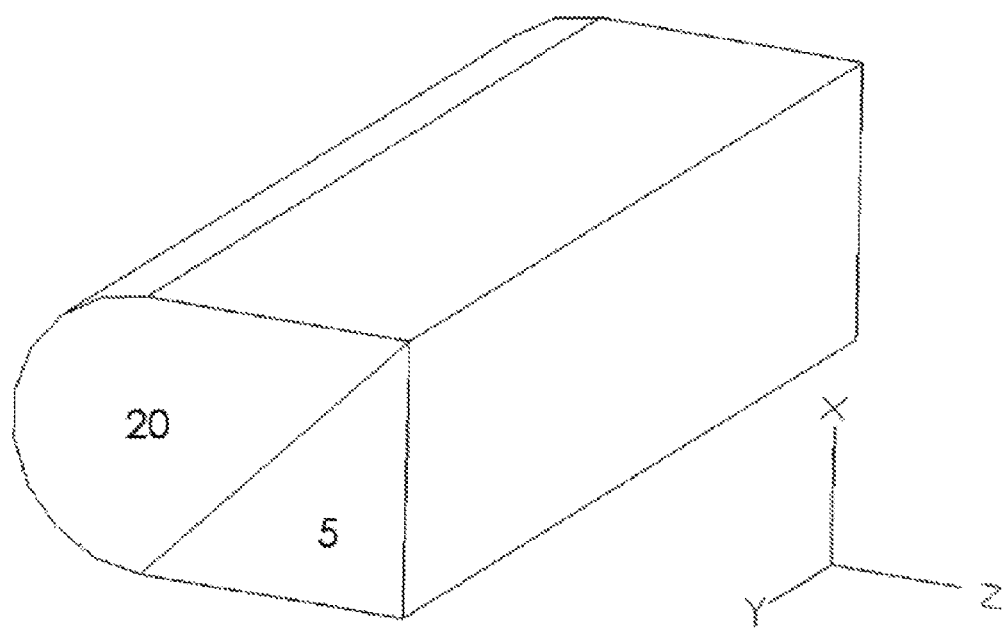
FIG. 8 is a schematic view of an integrated PBS with a cylindrical lens according to one embodiment of the present invention.

Both light I/O surface and LSFP can be either the long side surface on the right angle prism, or virtual surfaces off the prism in case the prism is not right angle prism and its long side surface is not perpendicular to input or output light beams. In addition, light I/O surface can be either planar surface or surface in other shapes, such as cylindrical surface (FIG. 8).

Incoming light beams in array (1, 1, 1) are already collimated in transverse direction X and with un-collimated divergence in lateral direction Y. They are polarized in transverse direction X indicated by the short bars on light beam in the drawing. The beams propagate along Z direction as what arrows on light beams indicate, and enter PBS through light I/O surface A. After entering PBS, they pass the PBS interface since they are P polarized, then they emerge out of PBS through LSFP C becoming array of beams (2, 2, 2). This array of beams continues to propagate until it reaches light processing surface which is the surface of array of roof reflectors 7, and where each beam is retro-reflected back by its corresponding roof reflector in the array and rotated around its propagating direction by 90°. Then the reflected array of beams (3, 3, 3) travels back to PBS and enters through LSFP C, finally meets the PBS interface again. Due to the 90° rotation, the polarization of light beams in the array (3, 3, 3) becomes S polarization to PBS, so that they all are reflected by the PBS interface and emerge out of PBS through light I/O surface B. Thus, the SDPs of the emerged array of beams (4, 4, 4) are changed, so that focusing them into a small point becomes possible, beam shaping completes.

The array of roof reflectors 7 consists of some roof reflectors. A roof reflector consists of two planar mirrors, their intercept line is the ridge of roof reflector; the dihedral angle is 90°. All of the roof reflectors are aligned along the lateral Y direction with their ridges oriented at angle 45° with the lateral direction, each roof reflector in FIG. 1 fully accepts one light beam. The array of roof reflectors retro-reflects incoming array of light beams and back it to the PBS with each light beam being rotated 90° around its propagating direction. The reflective surface of array of roof reflectors 7 facing PBS is light processing surface.

All of the roof reflectors in the array can be either identical or different from each other, arranged either periodically or not-periodically, as long as each beam in array (1, 1, 1) is processed by corresponding roof reflector, or sub-groups of beams in the array are processed by corresponding roof reflector depending on what SDP requires. As far as the reflection on surface of array of roof reflectors 7 is concerned, it can be either external reflection (FIG. 1) where the light processing surface is separated from PBS on a discrete device 7, or total internal reflection (TIR) (FIG. 6) where the light processing surface is integrated into PBS as one pieces 17.

Only one light processing surface is needed for light beam in perfect (P or S) polarization, otherwise two light processing surfaces are needed. In case only one light processing surface is needed, the other light processing surface and corresponding LSFP could be virtual surfaces, it means that the other light processing surface and corresponding LSFP are not a physical existence and useless to function.

Figure 2:
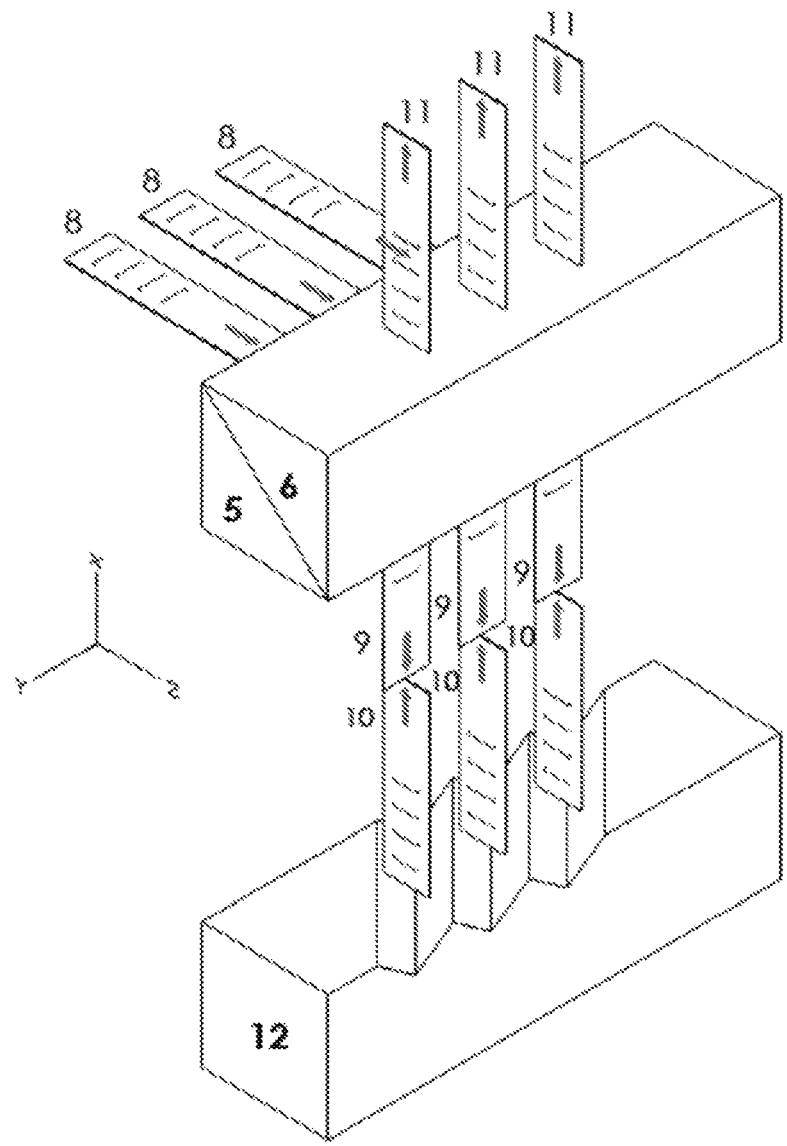
FIG. 2 is a schematic view of a basic unit of this invention including a polarization beam splitter, an array of roof reflectors, and its application for an array of S-polarized light beams.

FIG. 2 is a schematic view of another basic unit of this invention including one PBS and one array of roof reflectors which is placed differently than what is FIG. 1. Light beams in array (8, 8, 8) are the same as what in (1, 1, 1) except that they are polarized in Y direction which is S polarized to the PBS interface indicated by the short bars drawn on light beams. The process is similar to what is described in FIG. 1, except that light beams are reflected by the interface of PBS first and LSFP D is used instead LSFP C, then they pass the interface when they are retro-reflected back from array of roof reflectors 12. The processed light beams (11, 11, 11) emerge out of PBS through light I/O surface B. The surface of array of roof reflectors 12 facing the PBS 5, 6 is light processing surface, it retro-reflect light beams (9, 9, 9) and rotate each beam 9 by external reflection.

It should be pointed out that the basic unit of this invention shown in FIG. 1 and in FIG. 2 are the same, the difference between them is polarization status of incident light beams (1, 1, 1) and (8, 8, 8) is different.

It should be pointed out that it is not necessary to construct a PBS interface by two identical prisms. No matter it is right angle prism or not, one prism 5 or 6 can also be a PBS as long as its diagonal surface functions as the PBS interface. In case the one prism is right angle prism, one light I/O surface is physical surface which is long side surface of the prism and the other light I/O surface is virtual surface; and one LSFP is on the PBS and the other LSFP is off the PBS being virtual surface. If only prism 5 is used in FIG. 2, the propagating direction of light beams (11, 11, 11) will be different than what is shown in FIG. 2 due to light refraction at PBS interface, which will compress the width of output beams (11, 11, 11) in X-Z plane, which is in favor of beam focusing.

Generally speaking, any surface which functions as PBS is called PBS interface. A film which has PBS function can be PBS interface and substrate of the film is not essential. In this case, its two light I/O surfaces and two LSFPs are all virtual surfaces.

Figure 3:
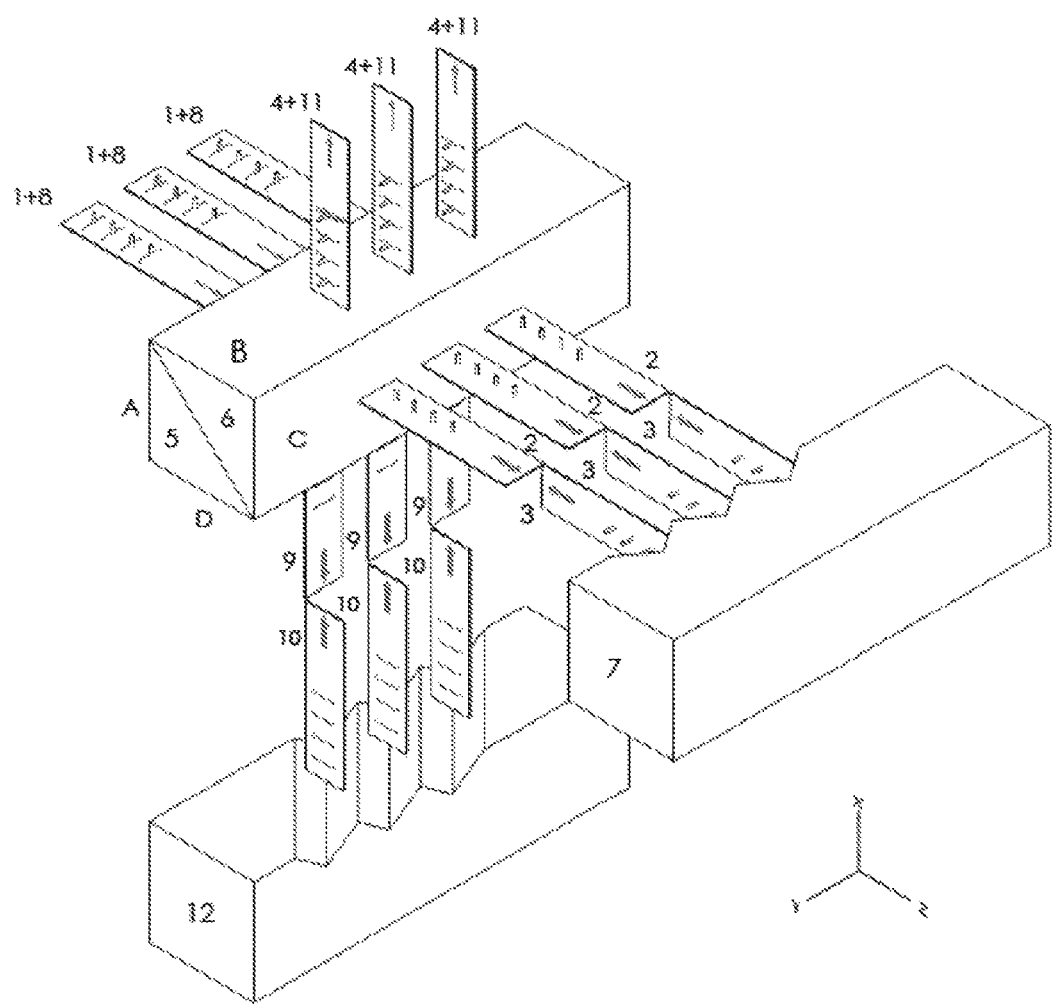
FIG. 3 is a schematic view of a basic configuration of this invention including a polarization beam splitter and two arrays of roof reflectors, this is the basic version using separate parts.

FIG. 3 is a schematic view of one of the embodiments of this invention, which is basic configuration of this invention using discrete parts: one PBS 5, 6 and two arrays of roof reflectors 7 and 12. This is indeed a combination of two basic units sharing one PBS or the combination of FIG. 1 and FIG. 2. The input light beams in array (1+8, 1+8, 1+8) are the same as what of beams in FIG. 1 and FIG. 2, except that they can be in any polarization status including non-polarized. The array of light beams (1+8) enters PBS through light I/O surface A. The PBS 5, 6 splits S and P components of each light beam (1+8) and sends them to different directions: S component emerges out of the PBS through LSFP D as array (9, 9, 9) while P component emerges out of the PBS through LSFP C as array (2, 2, 2). Then they travel to corresponding array of roof reflectors 12 and 7, respectively, where each light beam is retro-reflected and rotated by corresponding light processing surfaces of roof reflector 12 and 7. After being retro-reflected back, they become (10, 10, 10) and (3, 3, 3), respectively. They come back to PBS again and enter it through the same surfaces for LSFP D and C, respectively. The PBS interface passes and reflects them, respectively, there they are merged into one array of light beams (4+11) and emerge out of PBS through light I/O surface B. Thus, beam shaping completes, its SDPs are good for focusing.

Again, prism 5 can also be a PBS, but the propagating direction of light beams (2, 2, 2) and (4+11, 4+11, 4+11) will be different than what is shown in the drawing because of light refraction at PBS interface, the virtual I/O surface of the emerged light beams (4+11, 4+11, 4+11) will be diagonal surface and width of each beam (4+11) in X-Z plane will be compressed.

Figure 4:
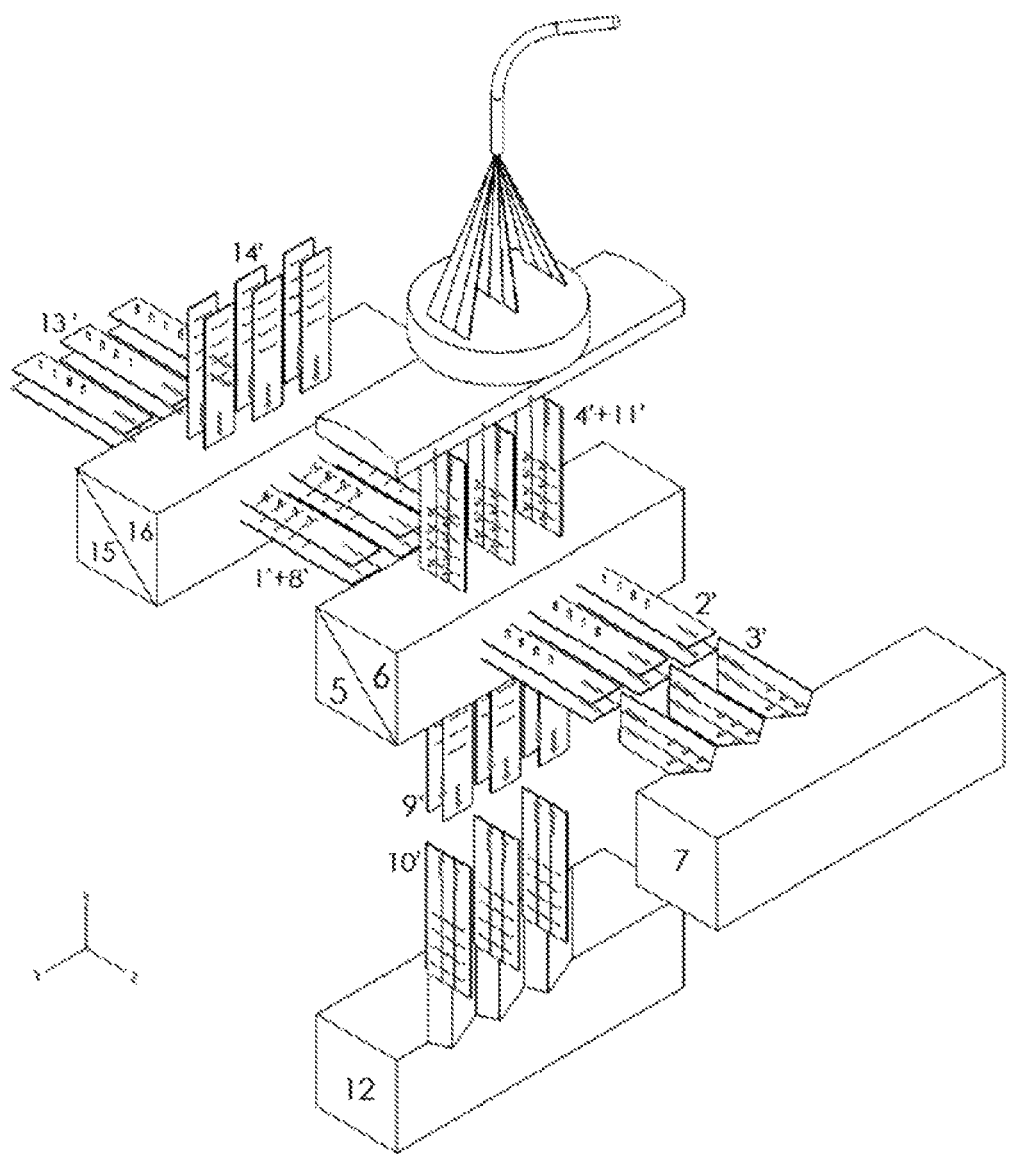
FIG. 4 is a schematic view of one of the embodiments of this invention, one more polarization beam splitter is added in order to combine more incident arrays of beams by their polarization, and focusing optics is added, too.

FIG. 4 is a schematic view of one of the embodiments of this invention where one more PBS 15, 16 is added and focusing optics is added, too. Both 13' and 14' are two dimensional (2D) array of incident light beams with same beam parameters as before, but their polarization is different: 13' is P polarized to PBS 15, 16 and 14' is S polarized to PBS 15,16. PBS 15, 16 combines them into a new 2D array of light beams (1'+8') and directs them to the second PBS 5, 6 where the beams are processed in the way described in FIG. 3. Finally, two emerged beam arrays (4'+11', 4'+11', 4'+11') enter focusing optics where cylindrical lens collimates the lateral Z divergence of light beams, then a focusing lens focuses them into a small spot which can fit into a fiber. Obviously, the power density at focus will be very high.

Figure 5:
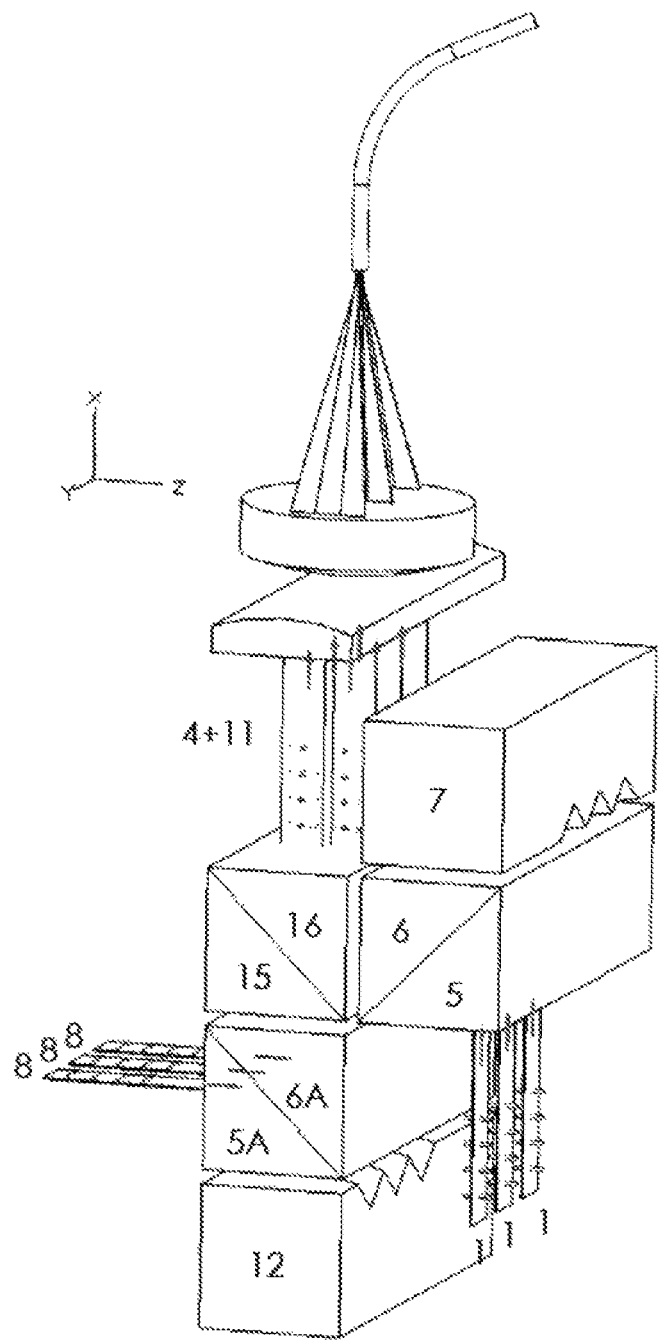
FIG. 5 is a schematic view of another embodiment of this invention including two basic unit of this invention, one polarization beam splitter, and focusing optics.

FIG. 5 is a schematic view of another embodiment of this invention where two basic units of this invention, 5, 6, 7 and 5A, 6A, 12 share one PBS 15, 16 as beam combiner. Incident array of light beams (1, 1, 1) is P polarized to PBS 5, 6, it enters and passes PBS 5, 6 and propagates to array of roof reflectors 7 where it is retro-reflected, each beam in it is rotated, and propagates back to PBS 5, 6 where it is reflected and sent to PBS 15, 16. In PBS 15, 16, it is reflected again and emerges out of PBS 15, 16 propagating in X direction (4+11). Another incident array of light beams 8 is S polarized to PBS 5A, 6A, it enters PBS 5A, 6A and is reflected down to array of roof reflectors 12 where it is retro-reflected back to PBS 5A, 6A with all of its light beams rotated, then it passes PBS 5A, 6A propagating to PBS 15, 16. In PBS 15, 16, it passes PBS 15, 16 and emerges out of PBS 15, 16 propagating in X direction (4+11). After beam shaping, the two emerged arrays of light beams (4+11) come to an optical system where beam divergence in lateral direction Z is collimated by a cylinder lens, then they are focused by a focus lens into a small spot which can fit into a fiber.

The approach here is to process incident light beams (8, 8, 8) and (1, 1, 1) separately first, then to combine them into a new array of light beams in PBS 15, 16; the approach is different from what is shown in FIG. 4: to combine them first, then to process them.

Figure 6:
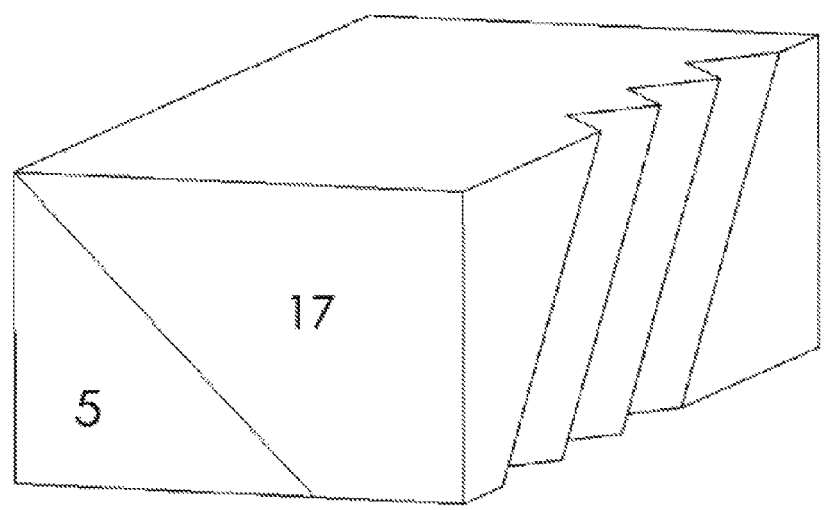
FIG. 6 is a schematic view of an integrated PBS with an array of roof reflectors according to one embodiment of the present invention.

FIG. 6 is a schematic view of an integrated version of basic unit of this invention showed in FIG. 1 and FIG. 2, i.e. a LSFP of PBS which is LSFP C in FIG. 1 turns into light processing surface of array of roof reflectors, as a result, two discrete parts are integrated into one piece. The advantage of this integration is obvious: firstly, a LSFP of PBS disappears and optical lose on it is avoided; secondly, the position accuracy between array of roof reflectors and the PBS interface is guaranteed by the accuracy of fabrication; thirdly, instead of external reflection, the reflection of light beam on roof reflector is TIR with high reflectivity and negligible de-polarization effect.

Figure 7:
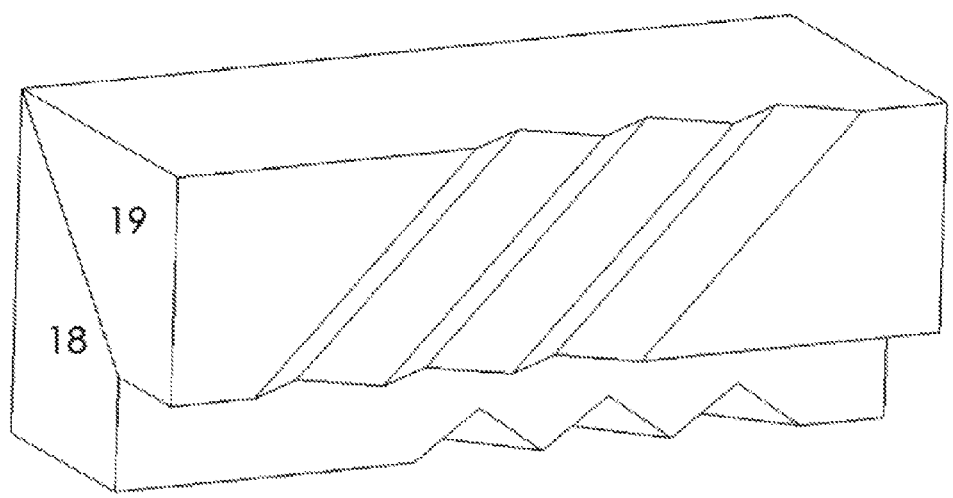
FIG. 7 is a schematic view of an integrated PBS with two arrays of roof reflectors according to one embodiment of the present invention.

FIG. 7 is a schematic view of an integrated version of basic configuration of this invention shown in FIG. 3, i.e. two light surfaces for processing of PBS turn into light processing surfaces of arrays of roof reflectors, as a result, three discrete parts, one PBS and two arrays of roof reflectors, are integrated into one piece. In other words, the PBS interface is integrated with two light processing surfaces of array of roof reflectors. The device is so compact that once incoming light beams enter it, all of the beam shaping processes described in FIG. 3 complete inside it, which provides stable and highly accurate operation. In addition, there is no worry about interference at PBS interface between retro-reflected beams from two arrays of roof reflectors since they are in different polarization status.

FIG. 8 is a schematic view of an integration of PBS and cylindrical lens 5, 20, or a PBS with a light I/O surface turned into cylindrical surface showing constant power in transverse planes in parallel to X-Z plane. This cylindrical surface can collimate divergence in transverse direction X of incident beam or collimate divergence in lateral direction of emerging beam. If this part is used to substitute PBS 5, 6 in FIG. 1 through FIG. 3, incident beams 1, 8 and 1+8 do not have to be collimated in transverse direction X before entering PBS.

Figure 9:
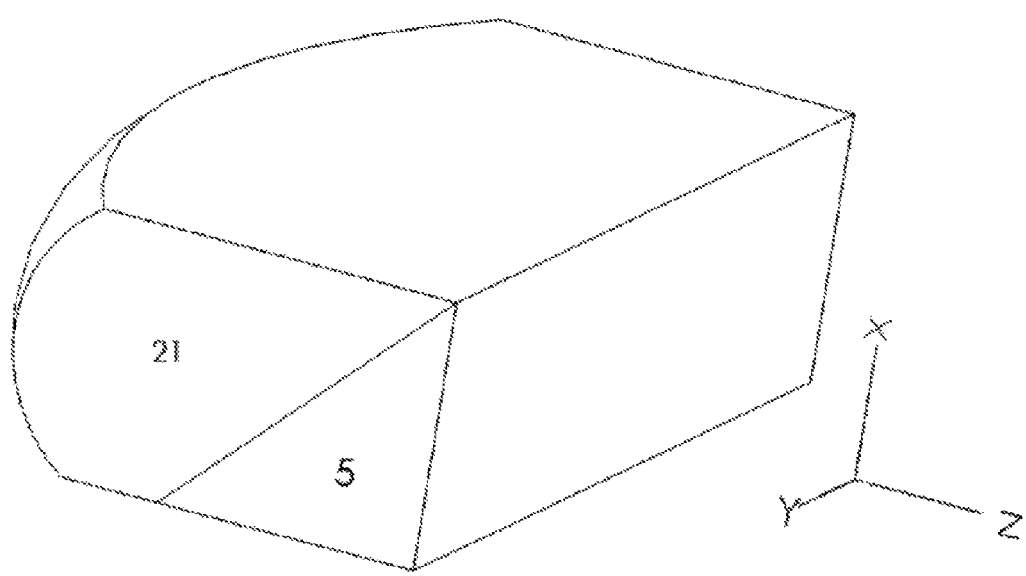
FIG. 9 is a schematic view of an integrated PBS with a two-dimensional cylindrical lens according to one embodiment of the present invention.

FIG. 9 is a schematic view of a variation of integrated PBS and cylindrical lens showed in FIG. 8. The cylinder lens 21 has one more power: in addition to the power in transverse X-Z plane shown in FIG. 8, there is another power in lateral Y-Z plane. For beam incoming to the part 5, 21 or out-coming from the part 5, 21 in Z direction, the two dimensional cylinder lenses can collimate beam divergence in both transverse X-Z plane and lateral Y-Z plane.

Figure 10:
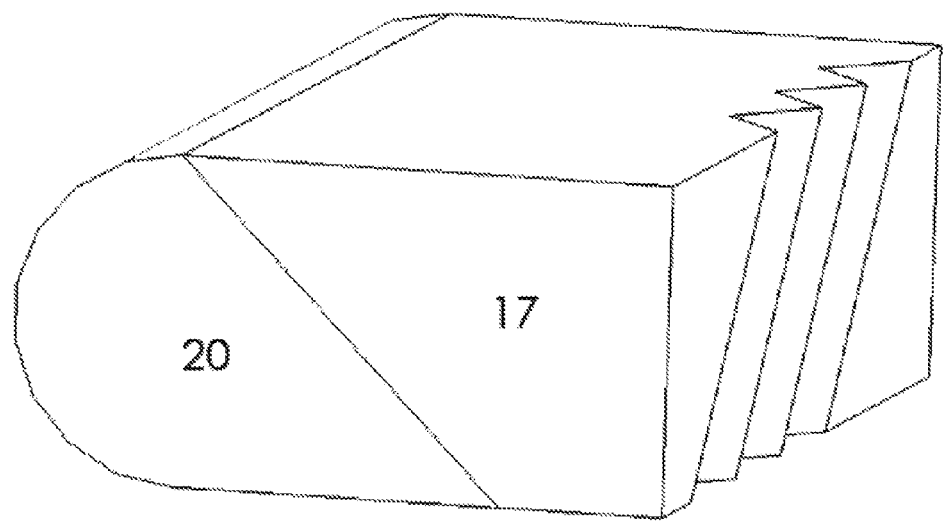
FIG. 10 is a schematic view of an integrated PBS with an array of roof reflectors and a cylindrical lens according to one embodiment of the present invention.

FIG. 10 is a schematic view of an integration of PBS with an array of roof reflectors and cylindrical lens 17, 20 or a variation of PBS where a light I/O surface turns into cylindrical surface and a LSFP on the other side of PBS interface turns into light processing surface of array of roof reflectors. It functions in the same way as what is shown in FIG. 1, in addition, the divergence of incoming beams (1, 1, 1) in lateral direction X can be collimated by light I/O surface of the PBS which is cylindrical surface now, and the retro-reflection of light beam on roof reflector is total TIR. As what is shown in FIG. 9, the cylindrical surface can have additional curvature in Y-Z plane.

Figure 11:
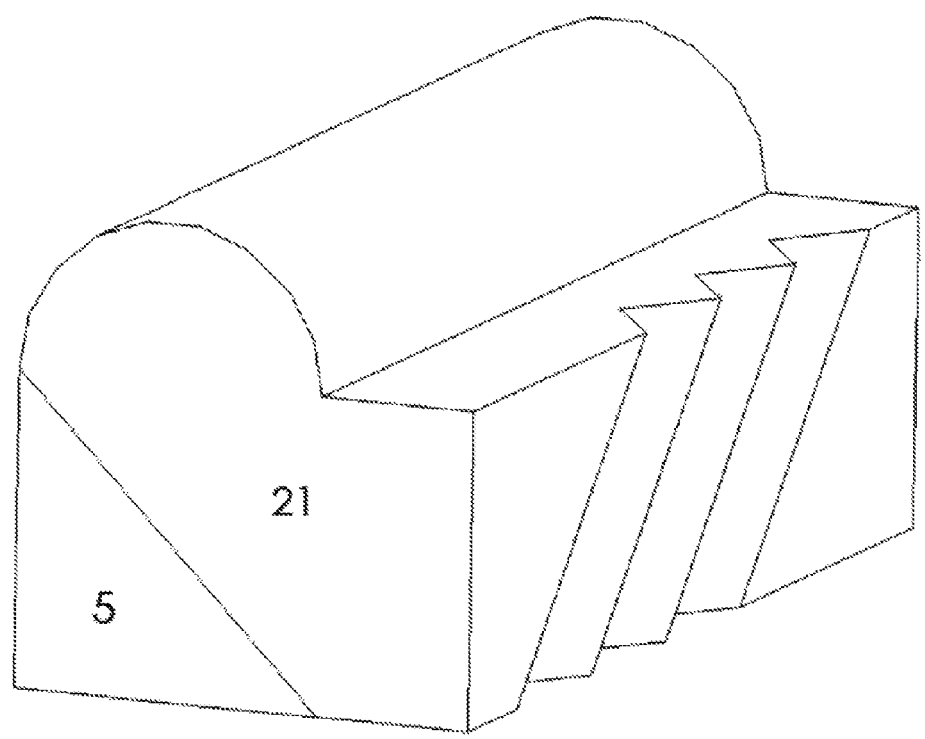
FIG. 11 is a schematic view of another configuration of integrated PBS with an array of roof reflectors and a cylindrical lens.

FIG. 11 presents integration of PBS with an array of roof reflectors and cylindrical lens 5, 21. This is a variation of PBS where a light I/O surface turns into cylindrical surface showing curvature in transverse plane (X-Z plane) and a LSFP on the same side of PBS interface turns into light processing surface of array of roof reflectors. The function of this device is the same as what is shown in FIG. 2, except that incoming beams (8, 8, 8) in FIG. 2 is divergent in lateral direction X and will be collimated by light I/O surface of the PBS which is cylindrical surface in FIG. 11. As what is shown in FIG. 9, the cylindrical surface can have additional curvature in X-Y plane.

Figure 12:
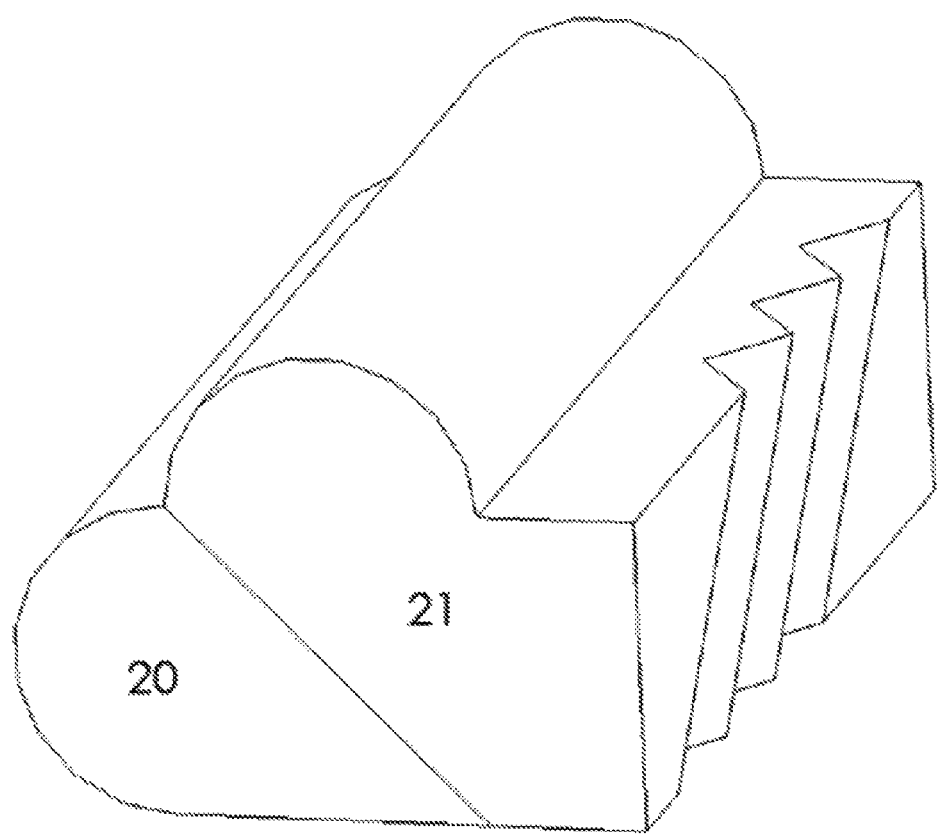
FIG. 12 is a schematic view of an integrated PBS with an array of roof reflectors and two cylindrical lenses according to one embodiment of the present invention.

FIG. 12 presents integration of PBS with an array of roof reflectors and two cylindrical lenses 20, 2. This is a variation of PBS, where two of its light I/O surfaces turn into cylindrical surfaces showing curvature in transverse plane (X-Z plane) and a LSFP turns into light processing surface of array of roof reflectors. If this device is used in the configuration shown in FIG. 1 or FIG. 2, divergences of incident beam 1 or 8 in both transverse and lateral directions will be collimated by the two cylindrical surfaces. As shown in FIG. 9, the cylindrical surface in 20 can have additional curvature in Y-Z plane, and the cylindrical surface in 21 can have additional curvature in X-Z plane.

Figure 13:
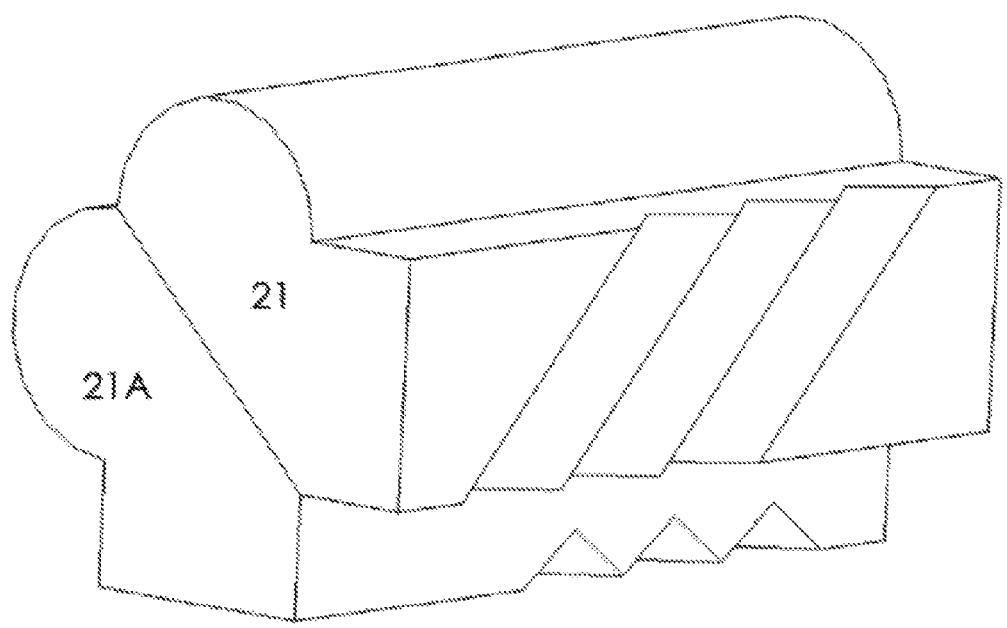
FIG. 13 is a schematic view of an integrated PBS with two arrays of roof reflectors and two cylindrical lenses according to one embodiment of the present invention.

FIG. 13 is a schematic view of an integration of polarization beam splitter with two arrays of roof reflectors and two cylindrical lenses 21 and 21A. This is a variation of PBS where two light I/O surfaces turn into cylindrical surfaces and two light surfaces for processing turn into two light processing surfaces of array of roof reflectors. If this device is used in the configuration shown in FIG. 3, divergences of incident beams (1+8, 1+8, 1+8) in both lateral and transverse directions will be collimated by the two cylindrical surfaces. Again, as what is shown in FIG. 9, the cylindrical surface in 21 can have additional curvature in X-Y plane, and the cylindrical surface in 21A can have additional curvature in Y-Z plane.

Figure 14:
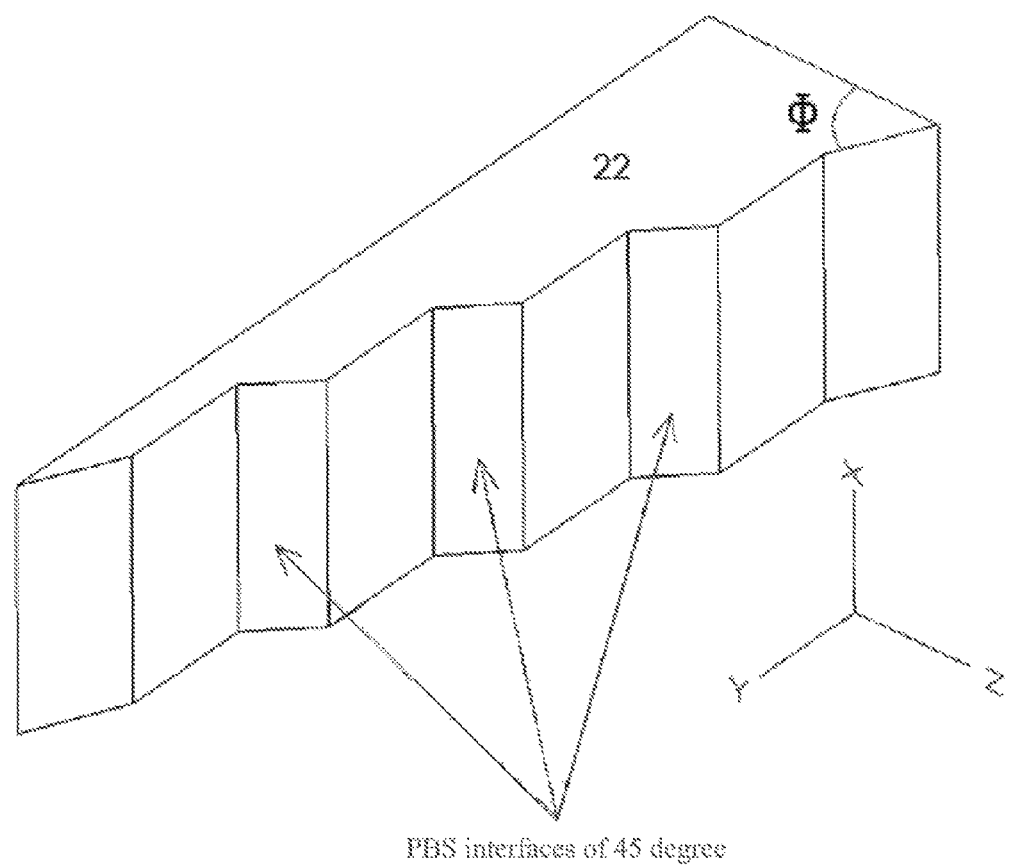
FIG. 14 is a schematic view of a modified right angle prism for PBS where two groups of facets are seen on its diagonal plane according to one embodiment of the present invention.

FIG. 14 is a schematic view of a modified right angle prism 22 for PBS where diagonal attaching plane turns into two groups of facets. In other words, PBS interface includes a group of planar PBS facets and another group of facets, the planar PBS facets and the facets being intervened with each other in one-by-one configuration. Facet orientation within one group is the same but different between groups. Only one group of planar facets marked with letter "F" functions as PBS interface. If $\Phi=45°$, the incident angle of light beam on PBS interface is $90°-\Phi=45°$. This group of planar PBS facets is separated by another group of facets which are not marked. The PBS planar facets can be either identical or not identical, arranged either periodically or not periodically depending on the array of light beams as long as each light beam in the array is processed by a corresponding planar PBS facet.

Figure 15:
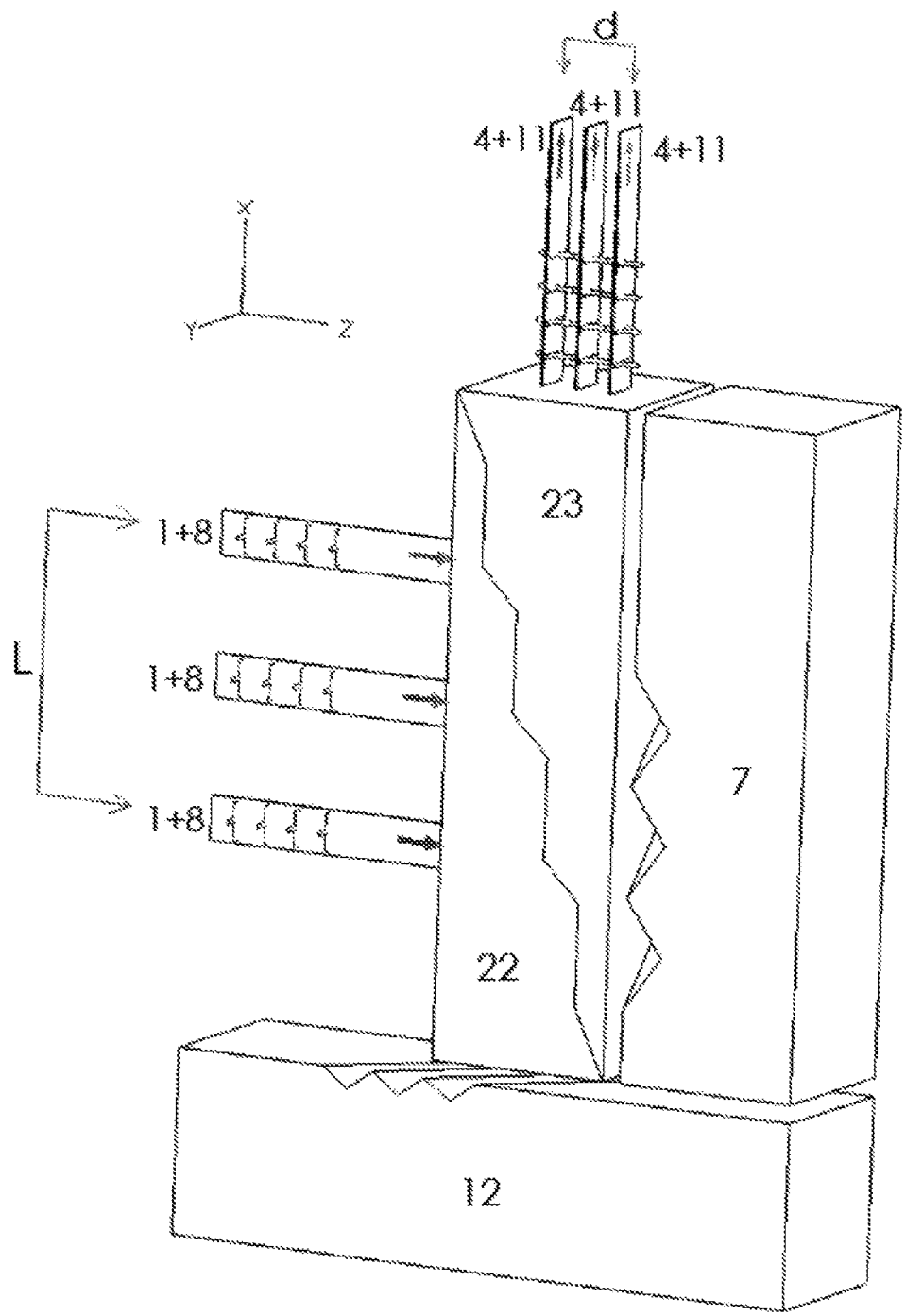
FIG. 15 is a schematic view of one of the embodiments of this invention where modified PBS and two arrays of roof reflectors are employed.

FIG. 15 is a schematic view of one of the embodiments of this invention where modified PBS 22, 23 and two arrays of roof reflectors 7 and 12 are employed. The two polarization components, P and S, in the incoming beam array (1+8, 1+8, 1+8) are separated by the PBS interface and sent to array of roof reflectors 7 and 12, respectively, for processing. Then the retro-reflected beams are combined on the PBS interface and sent out of PBS propagating in X direction. Again, the incoming beam array (1+8, 1+8, 1+8) can be in any polarization status including non-polarized. This is similar to what is shown in FIG. 3 except the modified PBS 22, 23 which compresses the span of beam array from L in the incoming side (1+8, 1+8, 1+8) into (d) in the output side (4+11, 4+11, 4+11).

It is worthwhile to point out that light beam (1+8) can be either a beam from one emitter on a diode bar or an array of light beams from a whole diode bar. In the latter case, this embodiment can stack many arrays of light beams from diode bars without physically stacking these diode bars. Because of the compression, array pitch of output beam array (4+11, 4+11, 4+11) is less than bar pitch in the incident side (1+8, 1+8, 1+8).

Figure 16:
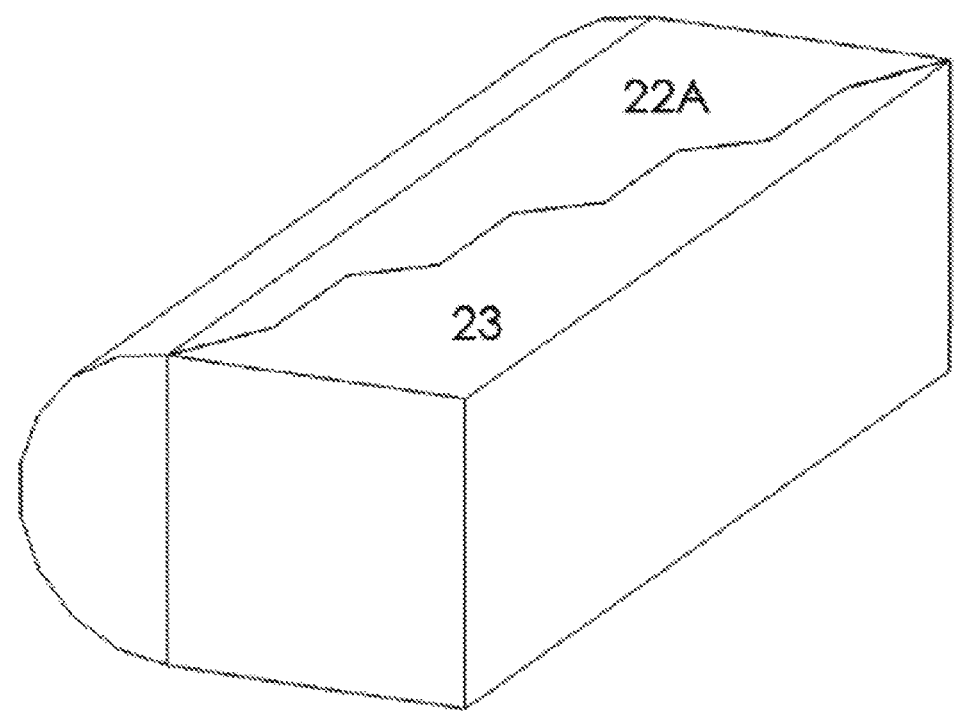
FIG. 16 is a schematic view of an integrated modified PBS and cylindrical lens according to one embodiment of the present invention.

FIG. 16 is a schematic view of a modification of integrated PBS 22, 23 in FIG. 15 where a light I/O surface turns into cylindrical surface 22A. If it is used in FIG. 15, transverse divergence of incoming beams (1+8, 1+8, 1+8) in Y direction will be collimated.

Figure 17:
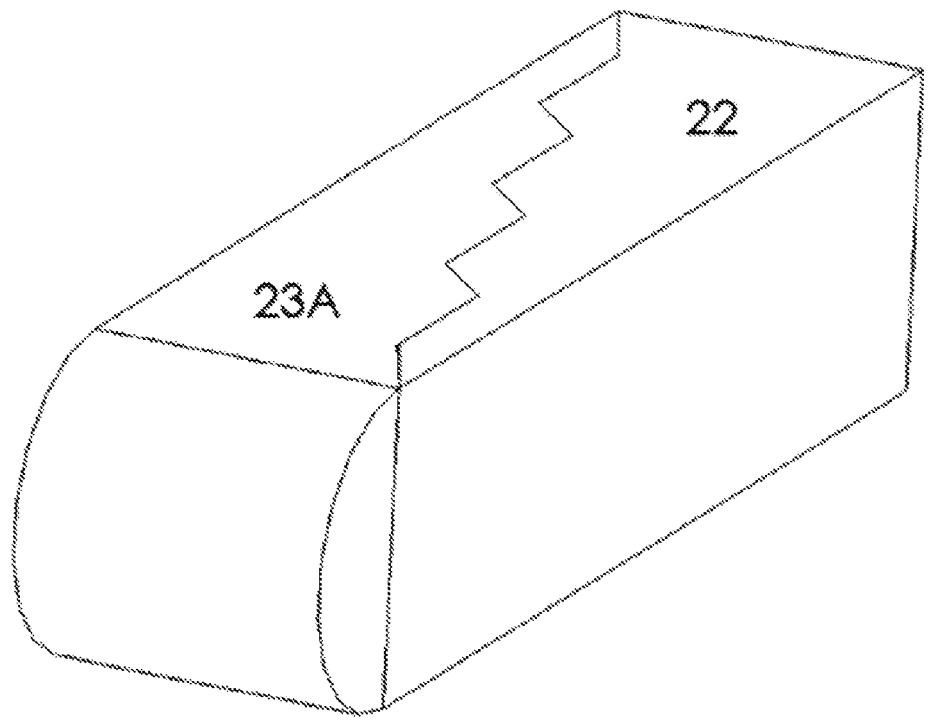
FIG. 17 is a schematic view of another configuration of integrated modified PBS and cylindrical lens according to one embodiment of the present invention.

FIG. 17 is a schematic view of another modification of integrated PBS 22, 23 in FIG. 15 where another light I/O surface turns into cylindrical surface 23A. If it is used in FIG. 15, lateral divergence in Y direction of emerging beams (4+11, 4+11, 4+11) will be collimated.

Figure 18:
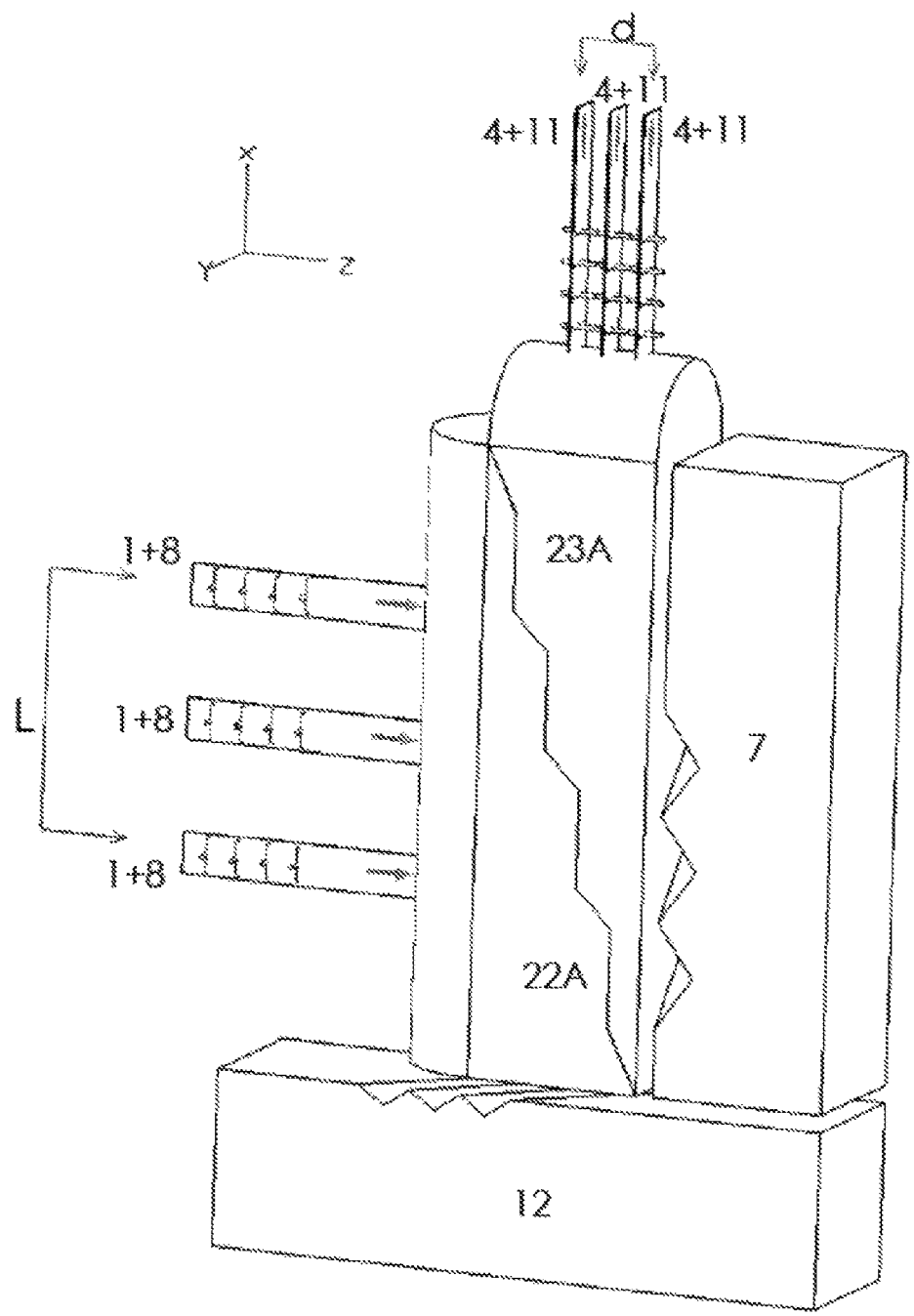
FIG. 18 is a schematic view of one of the embodiments of this invention where modified PBS with two cylindrical lenses and two arrays of roof reflectors are employed.

FIG. 18 is a schematic view of one of the embodiments of this invention where modified PBS with its two light I/O surfaces turn into two cylindrical surfaces 22A, 23A, two arrays of roof reflectors 7 and 12 are employed. The configuration is the same as what is showed in FIG. 15 where the incoming beams (1+8, 1+8, 1+8) have both lateral X and transverse Y divergences, the transverse divergences is collimated when the beams enter the PBS, while the lateral divergence is collimated when the beams (4+11, 4+11, 4+11) leave the PBS, in addition, the span of beam array is compressed from L to d.

Figure 19:
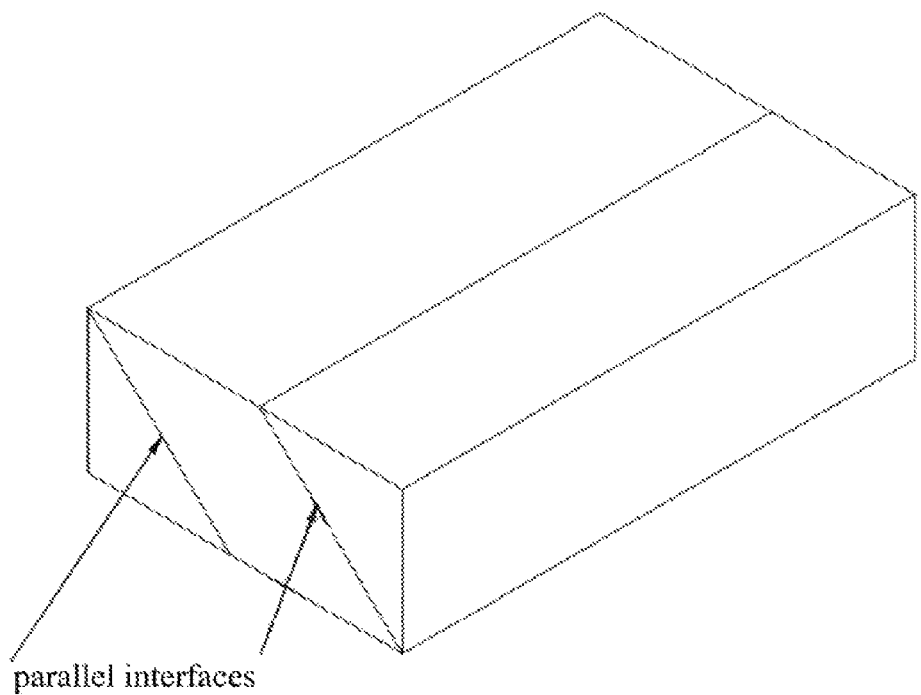
FIG. 19 is a schematic view of a multiple PBS wherein two PBS interfaces are parallel to each other according to one embodiment of the present invention.

FIG. 19 is a schematic view of an integration of two PBSs where two PBS interfaces are parallel to each other. In one of the embodiments of this invention shown in FIG. 4, PBS 15, 16 and PBS 5, 6 can be substituted by this integrated PBS. As a result, the optical lose at two PBS surfaces is avoided, in addition, alignment accuracy between the two PBSs is guaranteed by device manufacture.

Figure 20:
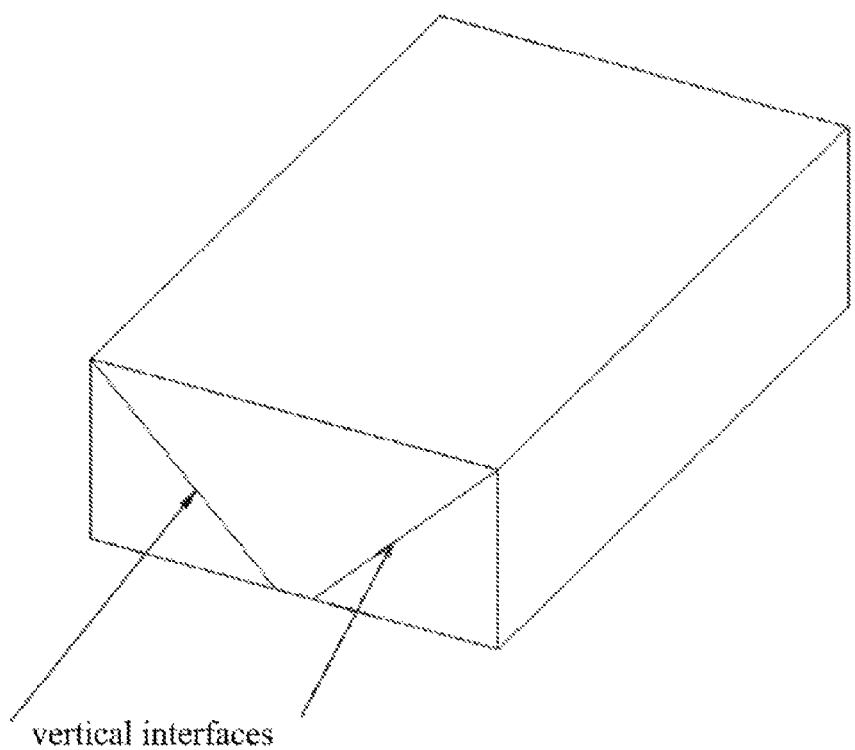
FIG. 20 is a schematic view of a multiple PBS wherein two PBS interfaces are perpendicular to each other according to one embodiment of the present invention.

FIG. 20 is a schematic view of another integration of two PBSs where two PBS interfaces are perpendicular to each other. In one of the embodiments of this invention shown in FIG. 5, PBS 15, 16 and PBS 5, 6 can be substituted by the integrated PBS. Again, the optical lose at two PBS surfaces is avoided, in addition, alignment accuracy between the two PBSs is guaranteed by device manufacture.

Figure 21:
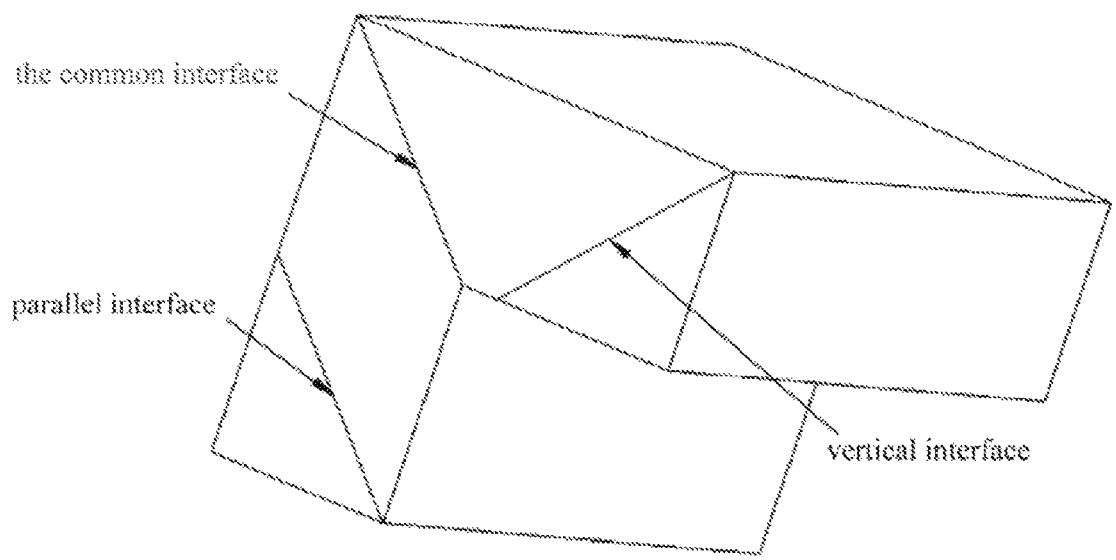
FIG. 21 is a schematic view of multiple PBS wherein three PBS interfaces are seen, one of them is common PBS interface, the second PBS interface is perpendicular to it and the third PBS interface is parallel to it according to one embodiment of the present invention.

FIG. 21 is a schematic view of an integration of three PBSs. One of them is the common PBS interface, the second PBS interface is perpendicular to the common PBS interface and the third PBS interface is parallel to the common PBS interface. In one of the embodiments of this invention shown in FIG. 5, PBS 15, 16, PBS 5, 6 and PBS 5A, 6A can be substituted by this triple integrated PBS. Again, the optical lose at four PBS surfaces is avoided, and alignment accuracy between the three PBSs is guaranteed by device manufacture.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A beam shaping device rotating each of incident light beams and, hence, altering a size-divergence product (SDP) in lateral and longitudinal directions, the beam shaping device comprising:
    a polarizing beam splitter (PBS) interface, for passing light beams in P polarization and reflecting light beams in S polarization;
    two light input/output (I/O) surfaces, one being perpendicular to the incident light beams and another being perpendicular to light beams that leave the PBS interface;
    two light surfaces for processing (LSFPs), one being perpendicular to light beams passing the PBS interface and another being perpendicular to light beams reflected by the PBS interface; and
    each of the LSFPs arranged to retro-reflect back, or close to retro-reflect back the incident light beams;
    wherein the PBS interface, the two light I/O surfaces, and the LSFPs are integrated into one piece, so that the light beams in the beam shaping device are total internal reflection.

2. The beam shaping device of claim 1, wherein said PBS interface is a planar surface.

3. The beam shaping device of claim 1, wherein said PBS interface includes a group of planar PBS facets and a group of another facets, the planar PBS facets and the another facets being intervened with each other in one-by-one configuration, the group of planar PBS facets having a same facet orientation and the group of another facets also having a same facet orientation, but the facet orientation of the planar PBS facets and the facet orientation of the another facets being different.

4. The beam shaping device of claim 1, wherein a physical surface of at least one of the light I/O surfaces is selected from one group consisting of a planar surface, a cylindrical surface, and a dual dimensional cylinder surface.

5. The beam shaping device of claim 1, wherein at least one of the two light I/O surface has curvature serving as beam collimation lens.

6. The beam shaping device of claim 1, wherein each of the LSFPs is a surface of an array of roof reflectors comprising of a plurality of roof reflectors arranged along the lateral direction, each of said roof reflectors being formed by two planar mirrors;
    the two planar mirrors providing an intercept line that is a ridge of the roof reflector and the two planar mirrors forming a dihedral angle 90°; and
    the ridges being parallel to each other and oriented at an angle 45°, or close to 45°, to the lateral direction and being arranged and oriented to retro-reflect back, or close to retro-reflect back light beams coming from said PBS interface to where they come from, and physically to rotate the light beams around their propagating direction by 90°, or close to 90°.

* * * * *